United States Patent [19]

Cygan et al.

[11] Patent Number: 5,015,972
[45] Date of Patent: May 14, 1991

[54] BROADBAND RF TRANSFORMER

[75] Inventors: Lawrence F. Cygan, Schaumburg, Ill.; Helge O. Granberg, Phoenix, Ariz.; Richard S. Bickham, Algonquin; Carl Missele, Elgin, both of Ill.

[73] Assignee: Motorola, Inc., Schaumburg, Ill.

[21] Appl. No.: 395,240

[22] Filed: Aug. 17, 1989

[51] Int. Cl.[5] .............................................. H03H 7/38
[52] U.S. Cl. ......................................... 333/32; 333/33; 336/61; 336/83; 336/200; 336/232
[58] Field of Search ......................... 333/32, 33, 24 R; 336/83, 61, 200, 232, 223

[56] References Cited

U.S. PATENT DOCUMENTS 3,539,959  11/1970  Wildi ..................................... 336/232
4,313,152   1/1982  Vranken .......................... 336/200 X
4,616,205  10/1986  Praught et al. ................... 336/83 X Primary Examiner—Thomas J. Kozma
Attorney, Agent, or Firm—Wayne J. Egan

[57] ABSTRACT

A broadband RF transformer design is described that facilitates the construction of a broadband impedance transformer in a compact, planar format, while retaining ease of assembly and manufacture. Broadband operation is achieved through the use of a slotted low-impedance winding structure, common-manufacture ferrite elements, and the optional placement of reactive elements between winding turns. By virtue of construction, thermal performance is enhanced, allowing operation at power levels not previously possible. The invention accommodates functional tuning via laser or abrading techniques. Also, the winding configuration eliminates the need to access the center of a spiral for the purposes of establishing a ground connection.

4 Claims, 3 Drawing Sheets

BROADBAND RF TRANSFORMER

TECHNICAL FIELD

This application relates to broadband transformers for RF power applications.

BACKGROUND OF THE INVENTION

Several methodologies are available for the design of an RF power amplifier. Stripline techniques, lumped LC networks, an broadband transformers are most commonly used for impedance matching functions in such designs. Practical implementation of wideband designs is facilitated most effectively through the use of broadband transformers.

Broadband transformers can be categorized either as conventional coupled winding structures or as transmission line transformers. Although transmission line transformers are useable at high frequencies, balanced to unbalanced winding transformations are often required in addition to the intended impedance transformation in such realizations. These structures are physically large and fabrication becomes difficult and costly.

Conventional coupled winding transformers are capable of balanced to unbalanced transformation while simultaneously providing the required impedance transformmation, but are useable only at low operating freqencies. Their fundamental limitation lies in the control of parasitic reactive elements internal to the construction of the transformer.

Used as impedance matching elements, the input and output transformers are among the most critical components in the design of a multi-octave amplier. The total performance of the amplifier (linearity, efficiency, VSWR tolerance, gain flatness) will depend on their quality.

In the past transformers capable of operating with low secondary impedances and large transformation ratios have been constructed using sections of low-dielectric constant, semi-rigid coaxial cable. Although occupying reasonable volumes, the units are difficult to fabricate, and are limited in power handling capability due to the thermal isolation of the inner conductor. One factor here is that these structures achieve low-frequency operation by the addition of E & I core-type ferrite materials using shapes that add to the manufacturing cost.

One approach that has been an improvement over the foregoing approach has been to construct the transformer in a planar format. Although using low cost ferrite plates, the laminate dielectric material limits operation to low-power levels, typically under 10 watts. The spiral winding geometry and multiple-turn secondary also necessitates the use of discrete crossover metalization and insulators.

Therefore, it would be desirable to produce an improved broadband RF transformer.

SUMMARY OF THE INVENTION

It is an object of the invention to provide an improved broadband RF transformer. According to the invention a broadband RF transformer is described that facilitates the construction of a broadband impedance transformer in a compact, planar format, while retaining ease of assembly and manufacture. Broadband operation is achieved through the use of a slotted low-impedance winding structure, common-manufacture ferrite elements, and the optional placement of reactive elements between winding turns. By virtue of construction, thermal performance is enhanced, allowing operation at power levels not previously possible. The invention accommodates functional tuning via laser or abrading techniques. Finally, the winding configuration eliminates the need to access the center of a spiral for the purposes of establishing a ground connection.

DETAILED DESCRIPTION OF THE INVENTION

Figure 1A:
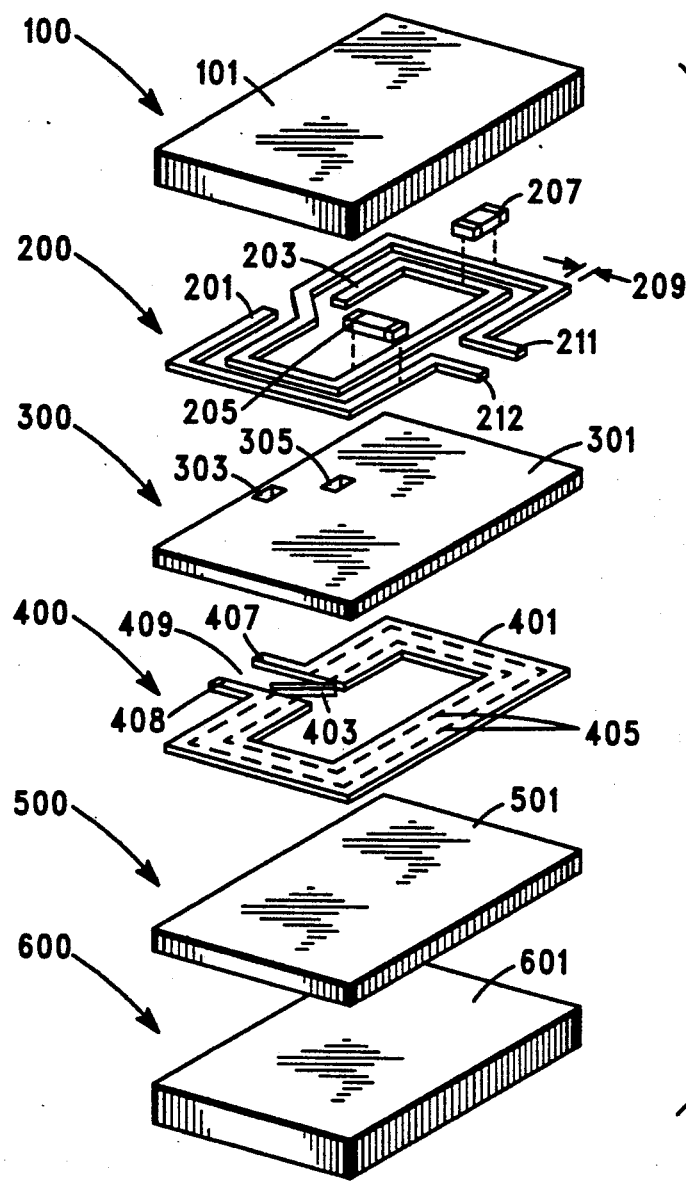
FIG. 1a shows an exploded view of the first embodiment of a broadband RF transformer, according to the invention.

FIG. 1a shows an exploded view of the first embodiment of the invention. The basic structure consists of a multi-turn high impedance primary winding layer 200 separated from a single-turn low impedance secondary winding layer 400 by a glass dielectric layer 300. As shown, the primary winding comprises a first metalization area 201 and a second metalization area 203, whereas the secondary winding comprises a single metalization area 401. The dielectric layer 300 is typically 4–8 mil thick. The planar format for the windings and dielectric allows for convenient manufacture via thick-film screening processes.

There is also shown in FIG. 1a a parallel-plate transmission line system, formed by the high impedance primary winding 201, 203 over the low impedance secondary winding 401, separated by the dielectric 300. When the primary load impedance at terminals 211 and 212 is known and the secondary load impedance at terminals 407 and 408 is known, the characteristic impedance of this system is given by the well-known relationship: $z_0 = [z_1 z_1 z_2]^{\frac{1}{2}}$ where $z_1$ is the primary load, $z_2$ is the secondary load, and $z_0$ is the characteristic impedance. The width 209 of the primary winding 201, 203 is related to the inverse of the characteristic impedance $z_0$. As with conventional transformers, the impedance transformation ratio is dependent on the turns ratio squared. In practice, the length of the single-turn secondary winding 401 is limited to $\frac{1}{8}$ wavelength at the highest frequency of operation to eliminate unintentional transmission line resonances.

In applications requiring a large transformation ratio and secondary impedances on the order of a few ohms (e.g., RF power transistors), the above constraints result in a primary winding comprised of multiple turns of a physically wide conductor. To ensure a compact structure, a high-K (dielectric constant) dielectric deposited in a thin layer permits realization of the appropriate characteristic impedance while maintaining a manageable line width. The high dielectric constant further operates to reduce the physical length of the $\frac{1}{8}$ wavelength winding, by reducing its phase velocity.

The thin dielectric 300 facilitates close coupling between the primary and secondary windings, as required for a low loss transformation. If the dielectric 300 is too thin and/or possesses a very high dielectric constant, excessive capacitance between the windings will appear across the load to be transformed, resulting in poor high frequency response. This effect is minimized through the deposition of the single turn secondary 401 with a slot geometry 405 in its metalization at regular intervals, along the path of the primary. The slot geometry 405 diminishes the inter-winding capacitance while maintaining tight coupling between the primary 201, 203 and secondary 401. Excessively large slot areas have the effect of reducing the coupling between the primary and secondary, thereby increasing loss. The slot dimensions must therefore be chosen to allow operation at the highest frequency of interest while maintaining low loss operation. In practice, satisfactory operation thru 200 Mhz has been effected with slots 100 mils long by 30 mils wide, spaced every 50 mils.

Figure 2A:
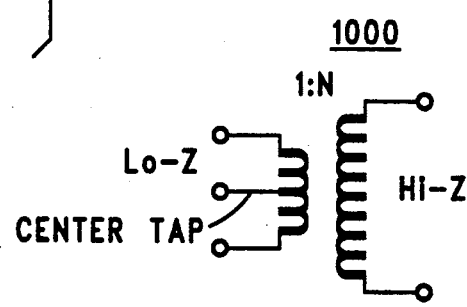
FIG. 2a shows a first electrical representation.
Figure 2B:
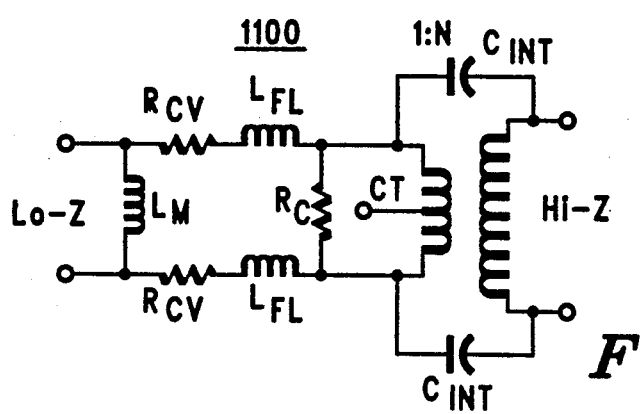
FIG. 2b shows a second electrical representation.

Extension of the transformer's response to low frequencies is accomplished by the addition of ferrite plate 100 and ferrite plate 600. Use of such material increases the magnetizing inductance $L_m$, as shown in FIG. 2b, without the need to increase the number of turns in the primary and secondary. The turns ratio, however, would remain constant. The ferrite slabs 100 and 600 shown are simple, inexpensive, easily manufacturable alternatives to the more complex ferrite shapes (e.g., E & L cores, pot cores, etc.) required by alternate transformer designs. The thickness and composition of plates 100 and 600 may vary according to the desired frequency, power, and temperature operating ranges of the transformer.

Figure 1B:
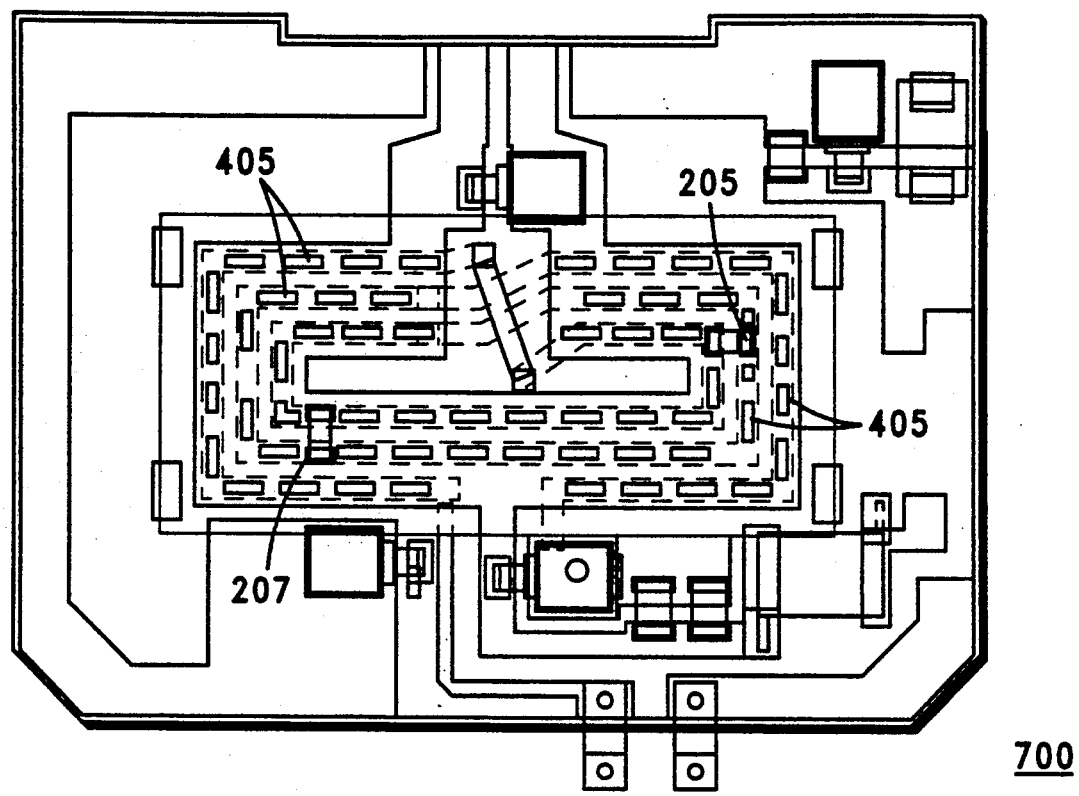
FIG. 1b shows a second view of the first embodiment.
Figure 3A:
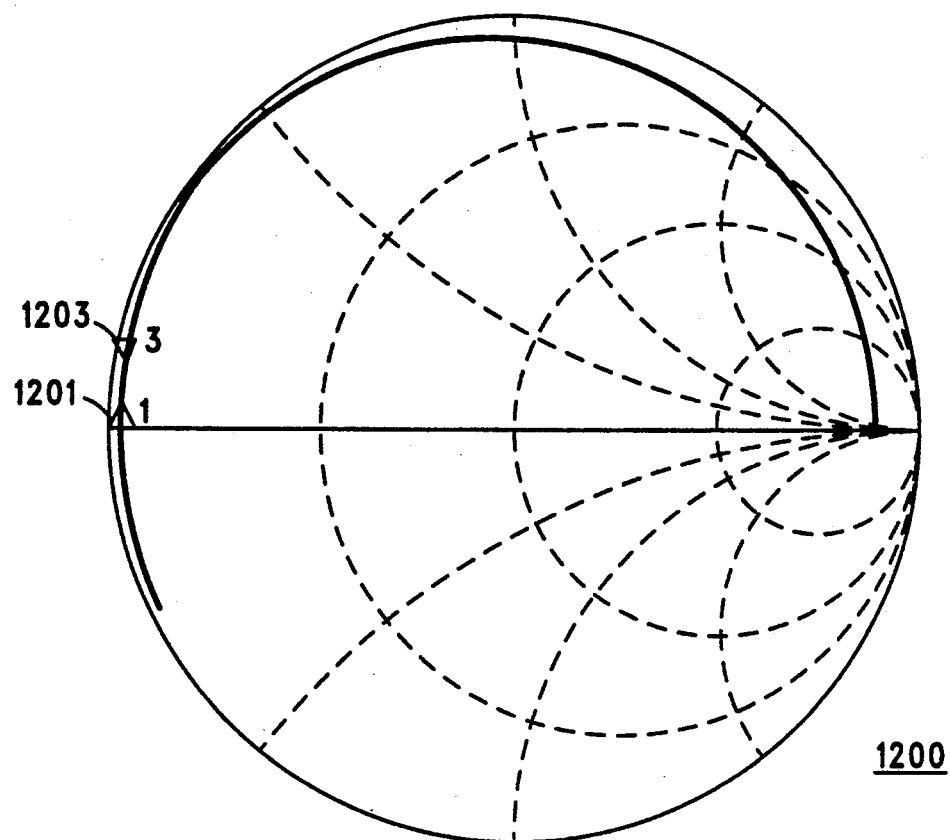
FIG. 3a shows a first impedance map.
Figure 3B:
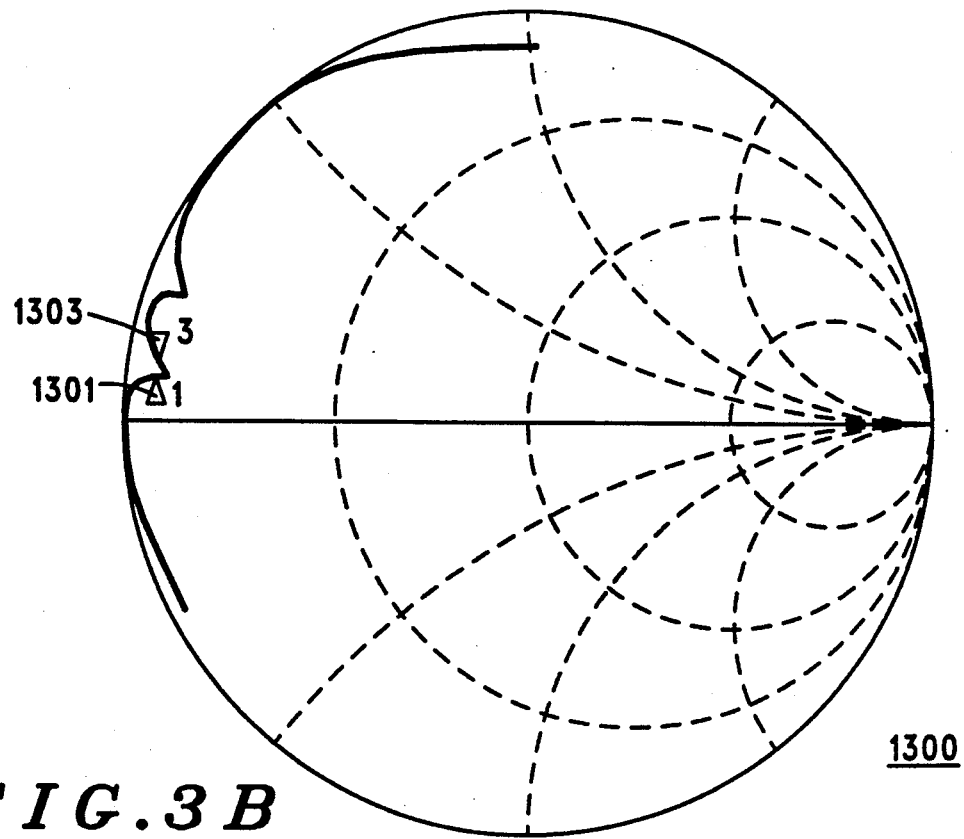
FIG. 3b shows a second impedance map.

At operating frequencies where the length of the primary winding 201, 203 exceeds the ⅛ wavelength limitation, the primary winding may be electrically shortened over a frequency interval by the addition of one or more bridging capacitors across adjacent or alternate turns of the winding 201, 203, such as capacitors 205 and 207. These primary winding bridging capacitors 205 and 207 are also shown in FIG. 1b. At operating frequencies in the 100 to 200 Mhz range, suitable capacitor values may be 100 pf, for example. Conceptually, the primary winding appears to be shortened in the frequency band where the reactance of the capacitor is small compared to that of the turn(s) which it bridges. At low frequencies, where the capacitive reactance is high, the line behaves as if the capacitor is absent. A resonance is established between the capacitor and the fraction of the total magnetizing inductance present between the turns bridged by the capacitor. The net effect is a compression of the impedance locus near the resonant frequency. FIG. 3a shows an impedance map 1200 generated between 132 MHz (marker 1201) and 174 MHz (marker 1203) looking into the low impedance winding of a 5-turn transformer (high impedance winding terminated with 50 ohms). With the addition of two capacitors placed across adjacent turn positions on the high impedance primary winding, the locus of impedance points between these two frequency limits becomes greatly compacted. This result can be appreciated with reference to FIG. 3b, which illustrates an impedance map 1300 generated between 132 MHz (marker 1301) and 174 MHz (marker 1303) after capacitors 205 and 207 have been installed. The effect has value in improving boardband performance, but generally requires the transformer to be constructed with additional turns (higher transformation ratio) to compensate for the impedance rise at resonance.

Referring still to FIG. 1a, thermal performance of the invention is enhanced through the use of an alumina substrate 500 or other thermally conductive substrate medium as a host for the winding and dielectric system. A typical thickness for substrate 500 is 35 mil. Winding conductor and dielectric losses, manifest as heat, are efficiently dissipated through such a substrate 500. The low impedance winding 401, with its high current density and associated higher power dissipation relative to the high impedance winding 201, 203 is the logical choice for deposition, directly on the substrate. Previous designs fabricated from printed circuit laminate materials were limited to operating powers below 10 watts. At higher levels, destruction of the dielectric material and/or delamination of the windings from the dielectric were observed.

Figure 1C:
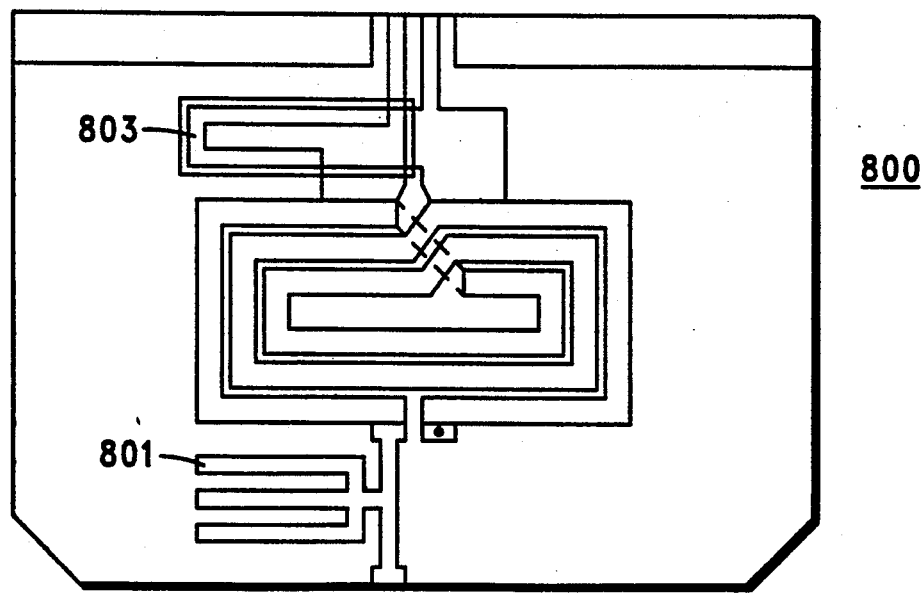
FIG. 1c shows a third view of the first embodiment.

In use, the magnetizing inductance $L_m$, shown in FIG. 2b, must be electrically compensated. This is accomplished through the addition of a capacitor across one or both of the windings. This action resonates the structure, typically at the center of the frequency band of interest. Assembly of the transformer on substrate 500 as described allows for the use of capacitors comprised of area plates above a ground plane, commonly referred to as "area capacitors." Turning to FIG. 1c, depicted element 801 is an area capacitor for the high impedance winding 201, 203 and depicted element 803 is an area capacitor for the low impedance winding 401. Such construction further allows these capacitors to be functionally turned or adjusted via laser or metalization abrading techniques. This method is proposed as an alternative to hand-selection of fixed values or trimmer capacitors, as is common in the prior art.

The geometry of the high impedance winding 201, 203 is unique in that it eliminates the need to elevate a conductor above the layer of plane 200 of the winding as would be necessary in making connection to the center of a spiral winding. Planar inductors and transformers make use of the spiral configuration when there is no need to access both ends of the winding, as is the case when a ground return is provided with a via hole through the substrate. Wound in the fashion shown in FIG. 1a, the low and high impedance connections are available on opposite sides of the transformer structure for layout convenience, while making available electrical connection to both ends of the windings. The feature is made possible by providing an open area 409 of the single turn secondary metalization area 401 in which a crossover 403 for the high impedance winding 201, 203 is deposited. As shown, crossover 403 is arranged to make contact with primary winding metalization areas 201 and 203 via holes 303 and 305 in dielectric layer 300. The insulator material for the crossover 403 is the same as used for the dielectric 300 separating the primary 201, 203 and secondary 401 windings. As shown, it is made a part thereof.

The invention, as described herein, is broadly applicable to RF circuits and systems requiring transformation of impedance levels between balanced and/or unbalanced sources and loads.

The winding features of the primary is additionally applicable to printed inductor elements in which access to both ends of the conductor is desired.

While various embodiments of a broadband RF transformer, according to the present invention, have been described hereinabove, the scope of the invention is defined by the following claims.

What is claimed is:

1. A boardband RF transformer having a primary metalization layer (200) forming multiple primary turns and primary terminals (211, 212), said primary metalization layer having an overlaying and adjacent first thermally-conductive ferrite layer (100) having a thickness, a secondary metalization layer (400) forming a single secondary turn (401) and secondary terminals (407, 408), a dielectric layer (300) having a thickness separating said primary layer and said secondary layer, said multiple primary turns generally overlaying said single secondary turn, said primary turns forming a path on said secondary turn when projected thereon, said secondary metalization layer having an underlaying and adjacent substrate layer (500) having a thickness and made of a thermally-conductive material, said substrate layer having an underlaying and adjacent second thermally-conductive ferrite layer (600) having a thickness.

2. The transformer of claim 1 wherein said secondary metalization layer includes a slot geometry (405) in its metalization along said path, said slot geometry comprising slots of a generally uniform thickness and length, said slots having a generally uniform spacing therebetween, the length of each slot generally parallel with said path.

3. The transformer of claim 1 having at least one bridging capacitor (205, 207) coupled between the primary turns.

4. The transformer of claim 1 wherein said primary metalization layer comprises a first primary metalization area (201) and a second metalization area (203), said secondary metalization layer having a crossover metalization area (403) deposited thereon, said crossover electrically insulated from said secondary turn, said first primary metalization area coupled to said crossover via a first hole (303) located in said dielectric layer, said second primary metalization area coupled to said crossover via a second hole (305) located in said dielectric layer.

* * * * *